United States Patent
Adkisson et al.

(10) Patent No.: US 7,303,952 B2
(45) Date of Patent: Dec. 4, 2007

(54) METHOD FOR FABRICATING DOPED POLYSILICON LINES

(75) Inventors: James W. Adkisson, Jericho, VT (US); John J. Ellis-Monaghan, Grand Isle, VT (US); Glenn C. MacDougall, Essex Junction, VT (US); Dale W. Martin, Essex Junction, VT (US); Kirk D. Peterson, Jericho, VT (US); Bruce W. Porth, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 283 days.

(21) Appl. No.: 10/711,771

(22) Filed: Oct. 4, 2004

(65) Prior Publication Data
US 2006/0073689 A1    Apr. 6, 2006

(51) Int. Cl.
*H01L 21/8238*    (2006.01)

(52) U.S. Cl. ............. 438/233; 438/306; 438/585; 257/E21.252; 257/E21.302

(58) Field of Classification Search ........ 438/229, 438/232, 233, 306, 585
See application file for complete search history.

(56) References Cited

U.S. PATENT DOCUMENTS

| 5,872,049 | A |   | 2/1999 | Gardner et al. |
| 5,930,617 | A | * | 7/1999 | Wu ............ 438/233 |
| 5,936,287 | A | * | 8/1999 | Gardner et al. ...... 257/369 |
| 6,352,900 | B1 |  | 3/2002 | Mehrotra et al. |
| 6,373,113 | B1 |  | 4/2002 | Gardner et al. |

* cited by examiner

*Primary Examiner*—Alexander Ghyka
(74) *Attorney, Agent, or Firm*—Schmeiser, Olsen & Watts; William D. Sabo

(57) ABSTRACT

A method of fabricating polysilicon lines and polysilicon gates, the method of including: providing a substrate; forming a dielectric layer on a top surface of the substrate; forming a polysilicon layer on a top surface of the dielectric layer; implanting the polysilicon layer with N-dopant species, the N-dopant species about contained within the polysilicon layer; implanting the polysilicon layer with a nitrogen containing species, the nitrogen containing species essentially contained within the polysilicon layer.

19 Claims, 10 Drawing Sheets

METHOD FOR FABRICATING DOPED POLYSILICON LINES

BACKGROUND OF INVENTION

1. Field of the Invention

The present invention relates to the field of semiconductor fabrication; more specifically, it relates a method of fabricating doped polysilicon lines and complementary metal-oxide-silicon (CMOS) doped polysilicon gates.

2. Background of the Invention

Advanced CMOS devices utilize doped polysilicon lines and gates with metal silicide layers as a method of improving and matching the performance of N-channel field effect transistors (NFETs) and P-channel field effect transistors (PFETs). However, controlling the width and sheet resistance of oppositely doped polysilicon lines and gates has become more important and difficult as the widths of polysilicon lines and gates have decreased. Therefore, there is a need for a method of fabricating doped polysilicon lines and gates with improved linewidth control.

SUMMARY OF INVENTION

A first aspect of the present invention is a method of fabricating a semiconductor structure, comprising: providing a substrate; forming a dielectric layer on a top surface of the substrate; forming a polysilicon layer on a top surface of the dielectric layer; implanting the polysilicon layer with N-dopant species, the N-dopant species essentially contained within the polysilicon layer; implanting the polysilicon layer with a nitrogen containing species, the nitrogen containing species about contained within the polysilicon layer.

A second aspect of the present invention is a method of fabricating a semiconductor structure, comprising: (a) providing a substrate; (b) forming a dielectric layer on a top surface of the substrate; (c) forming a polysilicon layer on a top surface of the dielectric layer; (d) implanting a first portion of the polysilicon layer with N-dopant species, the N-dopant species about contained within the polysilicon layer; (e) implanting a second and different portion of the polysilicon layer with P-dopant species, the P-dopant species about contained within the polysilicon layer; (f) implanting the first portion of the polysilicon layer with a nitrogen containing species, the nitrogen containing species essentially contained within the polysilicon layer.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

The present invention will be described using fabrication of doped polysilicon gates as exemplary of the fabrication process of the present invention. A doped polysilicon gate should be considered a doped polysilicon line used for a specific purpose.

Figure 1A:
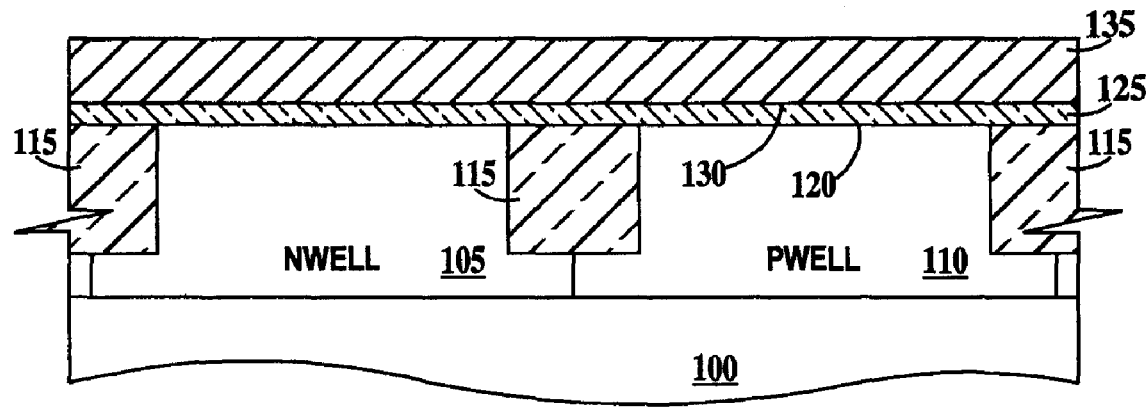
FIGS. 1A through 1D are partial cross-sectional views illustrating initial steps for fabricating doped polysilicon lines and gates according to a first embodiment of the present invention.

FIGS. 1A through 1D are partial cross-sectional views illustrating initial steps for fabricating doped polysilicon lines and gates according to a first embodiment of the present invention. In FIG. 1A, formed in a silicon substrate 100 are an N-well 105, a P-well 110 and shallow trench isolation (STI) 115. STI 115 may be formed by etching a trench into substrate 100, depositing a dielectric layer on a surface 120 of the substrate of sufficient thickness to fill the trench, and then performing a chemical-mechanical-polishing step to remove excess dielectric layer. However, formation of STI 115 is optional, and STI 115 need not be present. Formed on top surface 120 of substrate 100 is a gate dielectric layer 125. Formed on a top surface 130 of gate dielectric layer 125 is a polysilicon layer 135. In one example, gate dielectric layer 125 is thermal silicon oxide having a thickness of between about 0.8 nm to about 4 nm. In one example, polysilicon layer 135 is undoped polysilicon having a thickness of between about 40 nm to about 200 nm.

Figure 1B:
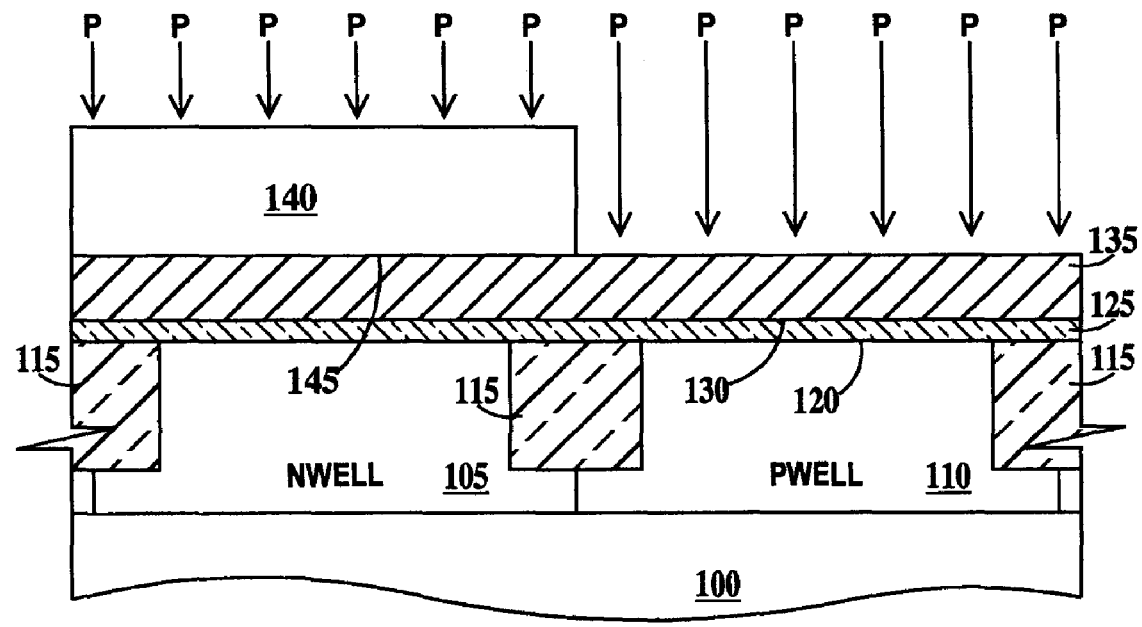
Figure 4:
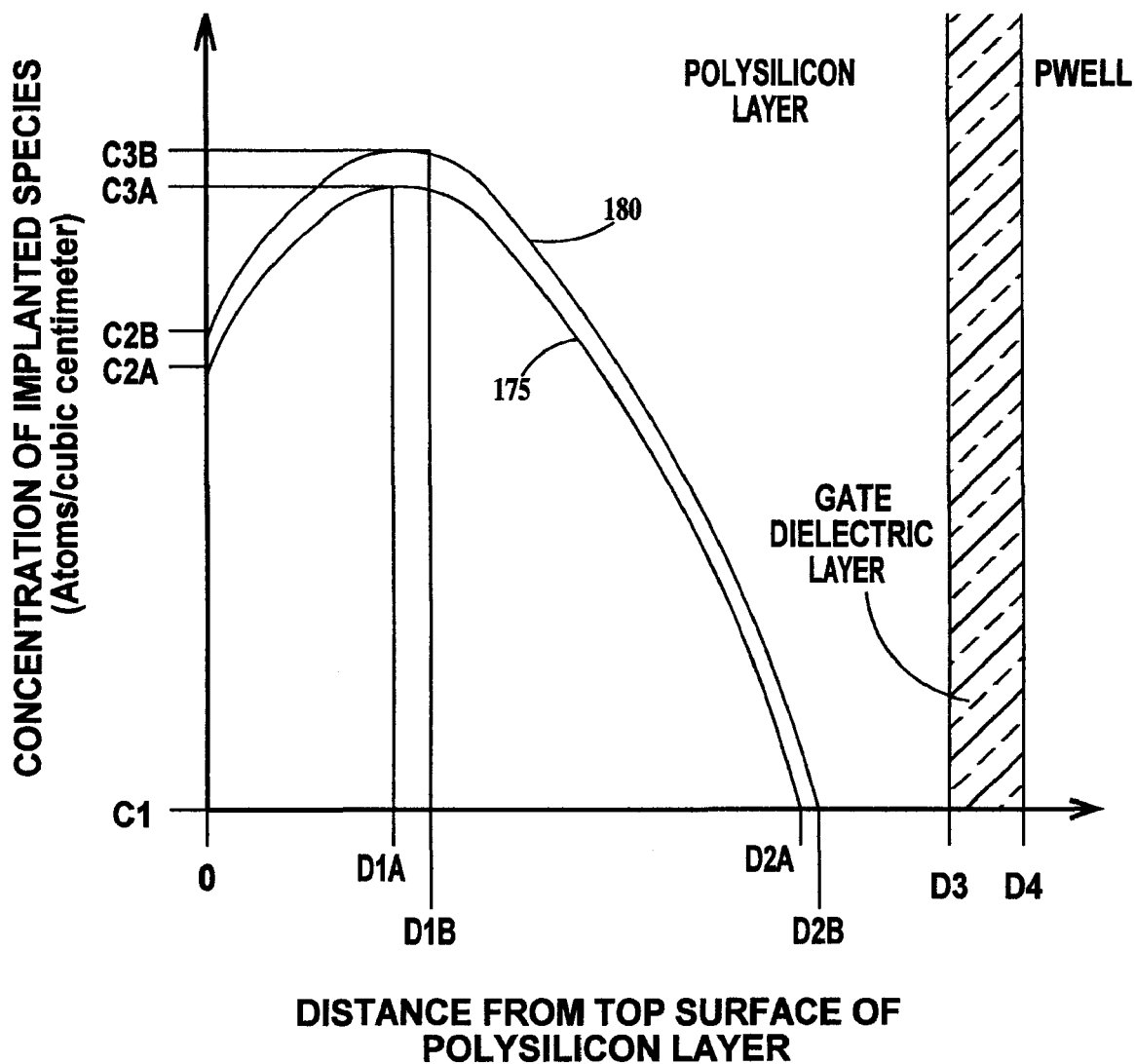
FIG. 4 is a plot of concentration of implanted species versus distance from a top surface of a doped polysilicon layer according to the present invention.

In FIG. 1B, a photoresist layer 140 is formed on a top surface 145 of polysilicon layer 135. Photoresist layer 140 is then removed from over P-well 110 by one of by one of any number of photolithographic methods known in the art. Then a phosphorus ion implantation is performed. Photoresist layer 140 is of sufficient thickness to about block phosphorus ion implantation into polysilicon layer 135 over N-well 105. The ion implantation is performed to place the peak (the maximum) of the implanted phosphorus distribution concentration (in atm/cm$^3$) proximate to top surface 145 of polysilicon layer 135. Proximate is defined herein as within about 0 nm to about a value of one fourth of the thickness of polysilicon layer 135. (See also FIG. 4, distances D1A and D1B). The ion implantation is further performed so that the concentration distribution profile of implanted phosphorus is such as to not significantly effect the overall P dopant level of P-well 110. The phosphorus ion implant concentration distribution profile is illustrated in FIG. 4 and described infra. In one example, with polysilicon layer 135 having a thickness of about 0.15 nm, phosphorus is implanted at a dose of about 5E14 atm/cm$^2$ to about 5E16 atm/cm$^2$ at an energy of about 30 Kev or less. Arsenic may be subsituted for phosphorus and the arsenic. In one example, with polysilicon layer 135 having a thickness of about 0.15 nm, arsenic is implanted at a dose of about 5E14 atm/cm$^2$ to about 5E16 atm/cm$^2$ at an energy of about 60 Kev or less. Photoresist layer 140 is then removed. In other examples, the phosphorus and arsenic doses and energies should be scaled proportionally to the thickness of polysilicon layer 135.

Figure 1C:
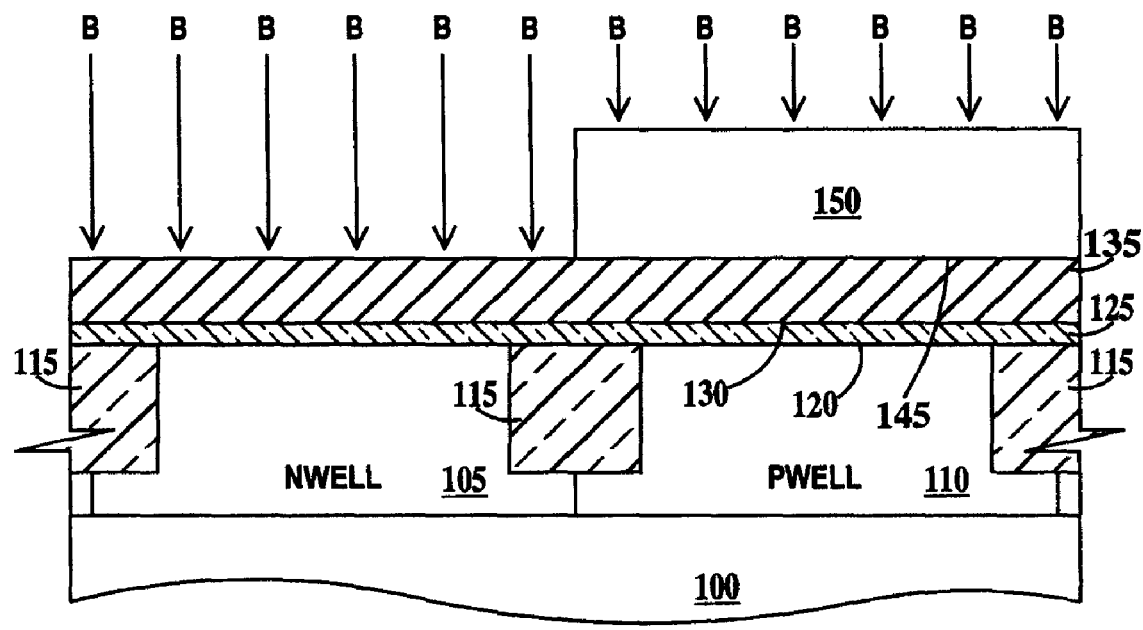

In FIG. 1C, a photoresist layer 150 is formed on top surface 145 of polysilicon layer 135. Photoresist layer 150 is then removed from over N-well 105 by one of any number of photolithographic methods known in the art. Then a boron ion implantation is performed. Photoresist layer 150 is of sufficient thickness to about block boron ion implantation into polysilicon layer 135 over P-well 110. The ion implantation is performed to place the peak of the implanted phosphorus distribution concentration profile proximate to top surface 145 of polysilicon layer 135. The ion implantation is further performed so that the concentration distribution profile of implanted boron is such as to not significantly effect the overall N dopant level of N-well 105. Photoresist layer 150 is then removed.

Figure 1D:
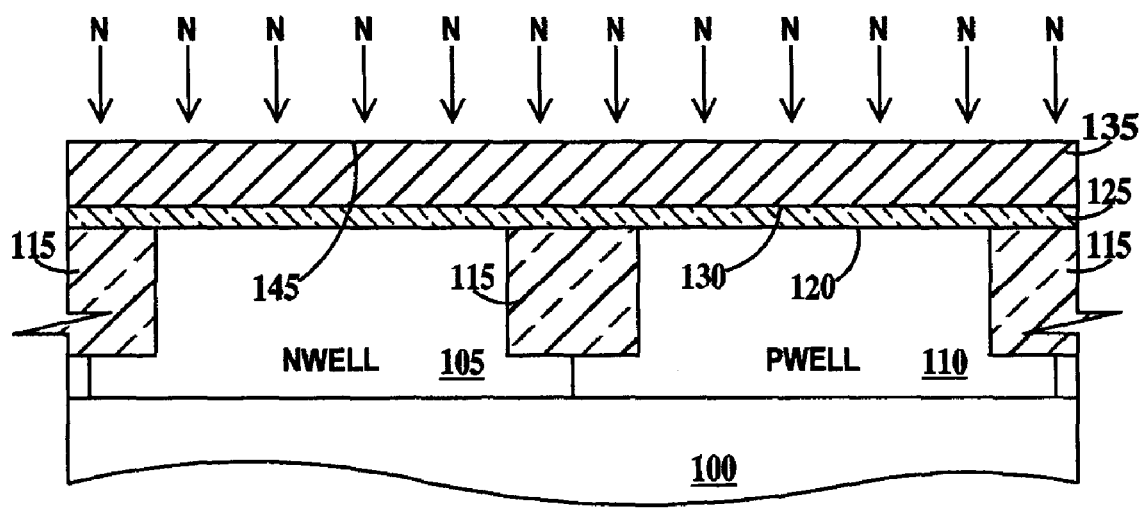
Figure 5A:
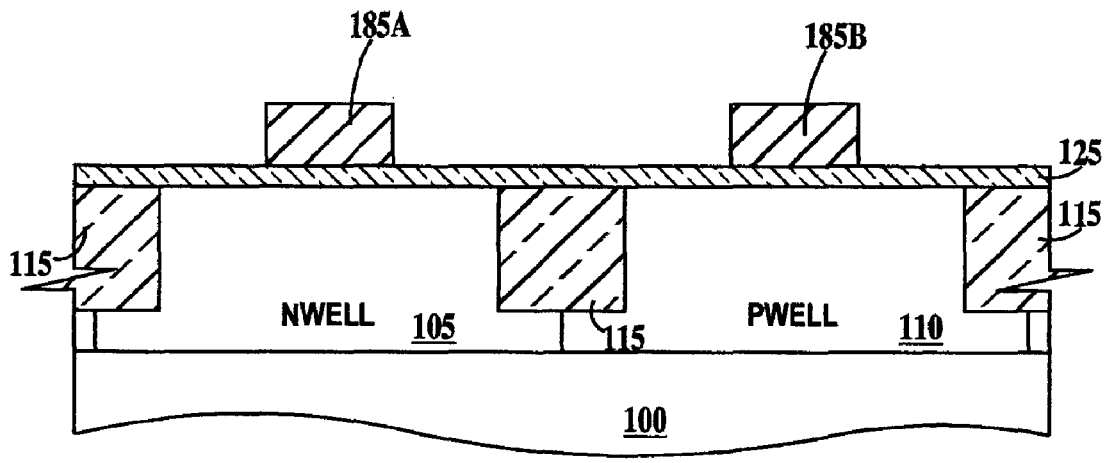
FIGS. 5A and 5B are partial cross-sectional views illustrating common intermediate steps for fabricating doped polysilicon lines and gates according to the present invention.
Figure 5B:
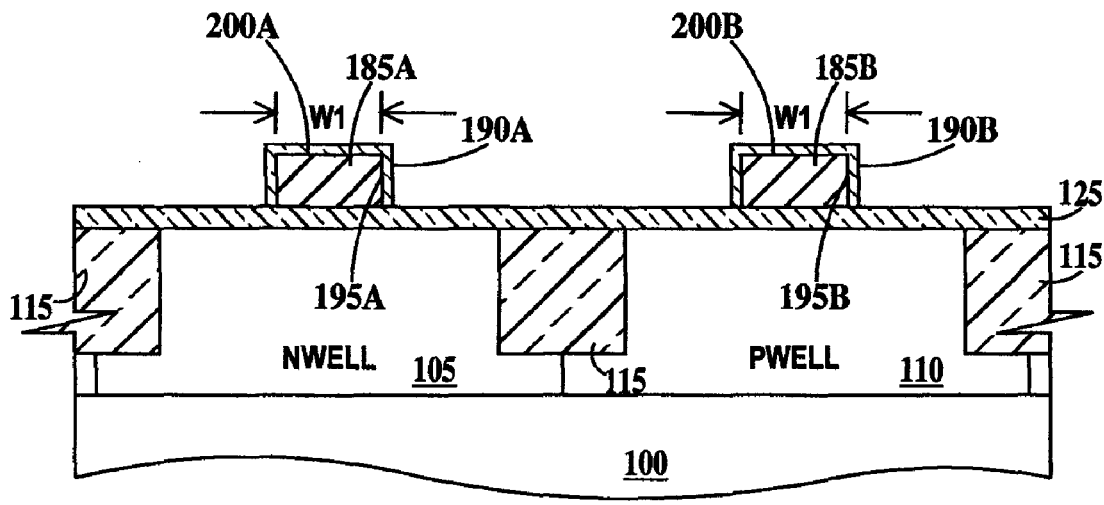

In FIG. 1D, a nitrogen containing species ion implantation is performed. The ion implantation is performed to place the peak of the implanted nitrogen species distribution concentration profile proximate to top surface 145 of polysilicon layer 135. The ion implantation is further performed so that the concentration of implanted nitrogen penetrating into either gate dielectric layer 125, N-well 105 and P-well 110 is not significant. The nitrogen ion implant concentration distribution profile is illustrated in FIG. 4 and described infra. In one example, with polysilicon layer 135 having a thickness of about 0.15 nm, nitrogen (as N) is implanted at a dose of about 1E14 atm/cm$^2$ to about 4E15 atm/cm$^2$ at an energy of about 20 Kev or less. Other suitable nitrogen species include but is not limited to N, $N_2$, NO, $NF_3$, $N_2O$ and $NH_3$. In other examples, the nitrogen dose and energy should be scaled proportionally to the thickness of polysilicon layer 135. The steps illustrated in FIGS. 5A and 5B are next performed.

For the first, as well as the second and third embodiments of the present invention, one intent of the phosphorus (or arsenic), boron and nitrogen containing species ion implantations is to keep a maximum amount as possible of implanted species contained within the polysilicon layer at the time of ion implantation as well as after various later heat cycles and to keep a minimum amount as possible of implanted species from penetrating through the polysilicon layer into the underlying layers or into the substrate. Thus, the ion implantations are shallow (low energy) with concentration peaks close to the surface of the polysilicon and concentration tails that fall off to very low concentrations while still within the polysilicon. Thus the implanted species is essentially contained within the polysilicon layer. Less than about 2E12 atm/cm$^2$ of any of the ion implanted species is intended to penetrate into substrate in the case of a polysilicon line or into the gate dielectric layer or N-well or P-well in the gate of polysilicon gates.

Figure 2A:
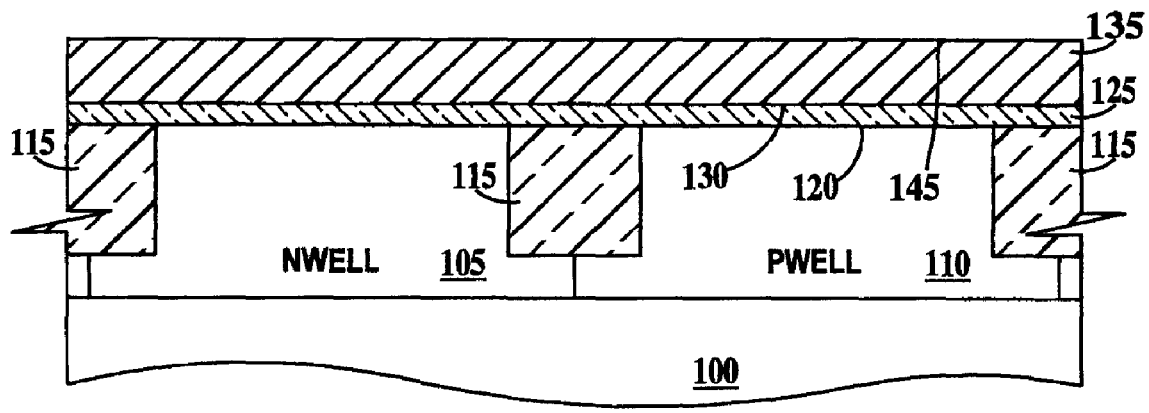
FIGS. 2A through 2D are partial cross-sectional views illustrating initial steps for fabricating doped polysilicon lines and gates according to a second embodiment of the present invention.
Figure 2B:
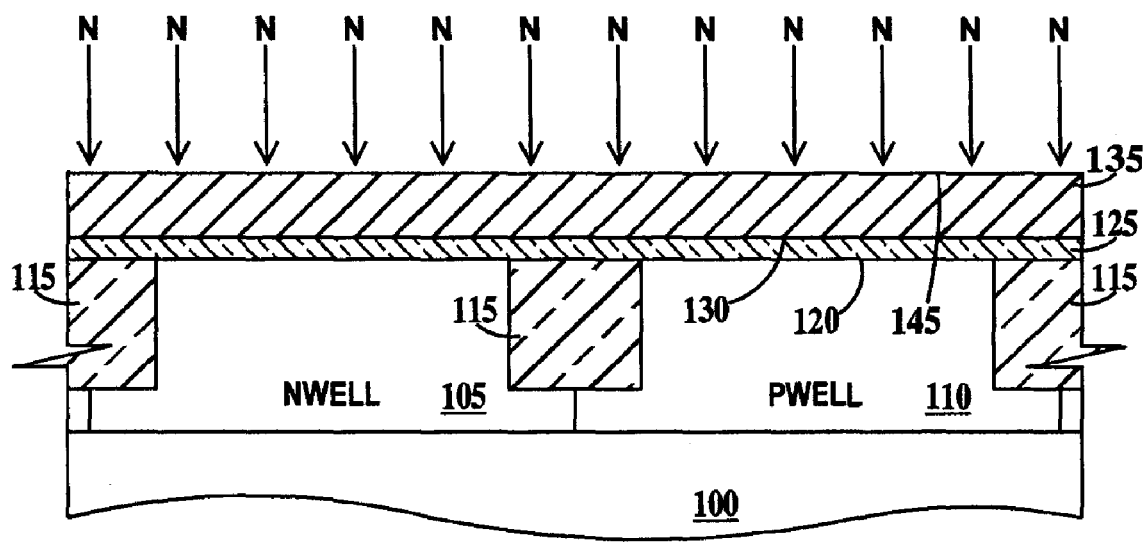

FIGS. 2A through 2D are partial cross-sectional views illustrating initial steps for fabricating doped polysilicon lines and gates according to a second embodiment of the present invention. FIG. 2A is identical to FIG. 1A. In FIG. 2B, a nitrogen containing species ion implantation is performed. The ion implantation is performed to place the peak of the implanted nitrogen species distribution concentration profile proximate to top surface 145 of polysilicon layer 135. The ion implantation is further performed so that the concentration of implanted nitrogen penetrating into either gate dielectric layer 125, N-well 105 and P-well 110 is not significant. The nitrogen ion implant concentration distribution profile is illustrated in FIG. 4 and described infra. In one example, with polysilicon layer 135 having a thickness of about 0.15 nm, nitrogen (as N) is implanted at a dose of about 1E14 atm/cm$^2$ to about 4E14 atm/cm$^2$ at an energy of about 20 Kev or less. Other suitable nitrogen species include but is not limited to $N_2$, NO, $NF_3$, $N_2O$ and $NH_3$. In other examples, the nitrogen dose and energy should be scaled proportionally to the thickness of polysilicon layer 135.

Figure 2C:
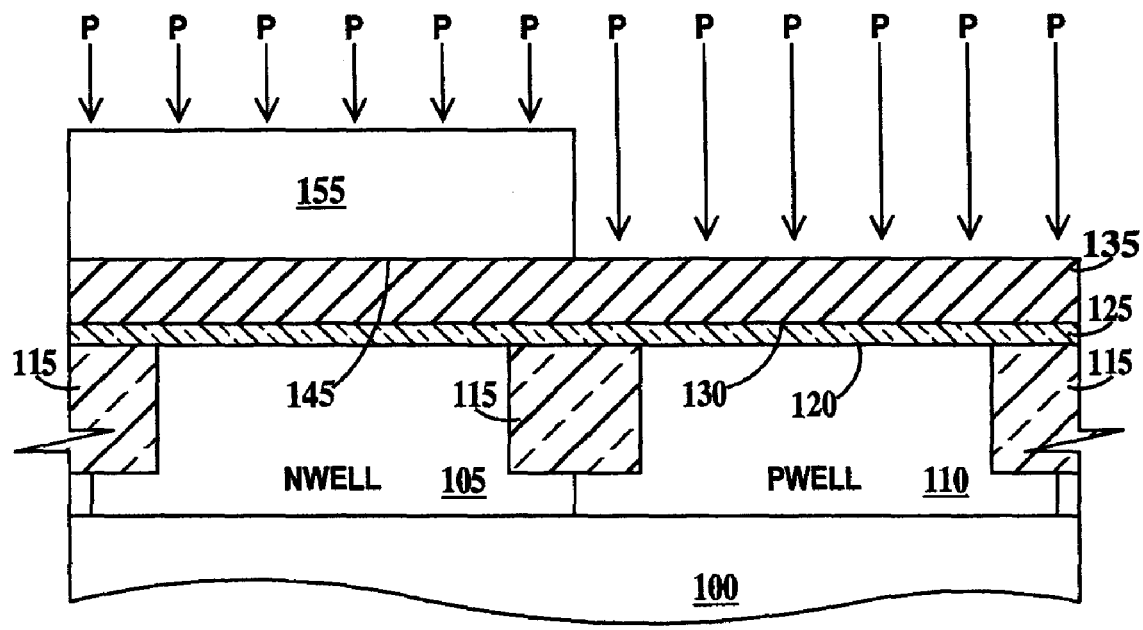

In FIG. 2C, a photoresist layer 155 is formed on top surface 145 of polysilicon layer 135. Photoresist layer 155 is then removed from over P-well 110 by one of any number of photolithographic methods known in the art. Then a phosphorus ion implantation is performed. Photoresist layer 155 is of sufficient thickness to about block phosphorus ion implantation into polysilicon layer 135 over N-well 105. The ion implantation is performed to place the peak of the implanted phosphorus distribution concentration proximate to top surface 145 of polysilicon layer 135. The ion implantation is further performed so that the concentration distribution profile of implanted phosphorus is such as to not significantly effect the overall P dopant level of P-well 110. The phosphorus ion implant concentration distribution profile is illustrated in FIG. 4 and described infra. In one example, with polysilicon layer 135 having a thickness of about 0.15 nm, phosphorus is implanted at a dose of about 5E14 atm/cm$^2$ to about 5E16 atm/cm$^2$ at an energy of about 30 Kev or less. Arsenic may be substituted for phosphorus. In one example, with polysilicon layer 135 having a thickness of about 0.15 nm, arsenic is implanted at a dose of about 5E14 atm/cm$^2$ to about 5E16 atm/cm$^2$ at an energy of about 60 Kev or less. In other examples, the phosphorus and arsenic doses and energies should be scaled proportionally to the thickness of polysilicon layer 135. Photoresist layer 155 is then removed.

Figure 2D:
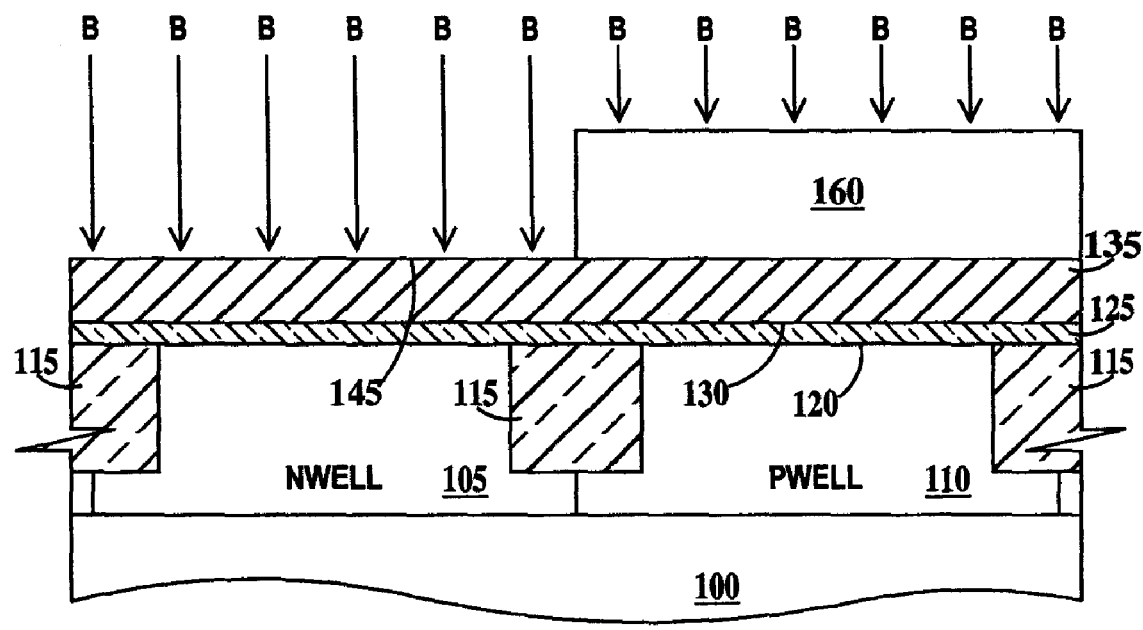

In FIG. 2D, a photoresist layer 160 is formed on top surface 145 of polysilicon layer 135. Photoresist layer 160 is then removed from over N-well 105 by one of any number of photolithographic methods known in the art. Then a boron ion implantation is performed. Photoresist layer 160 is of sufficient thickness to about block boron ion implantation into polysilicon layer 135 over P-well 110. The ion implantation is performed to place the peak of the implanted phosphorus distribution concentration profile proximate to top surface 145 of polysilicon layer 135. The ion implantation is further performed so that the concentration distribution profile of implanted boron is such as to not significantly effect the overall N dopant level of N-well 105. Photoresist layer 160 is then removed. The steps illustrated in FIGS. 5A and 5B are next performed.

Figure 3A:
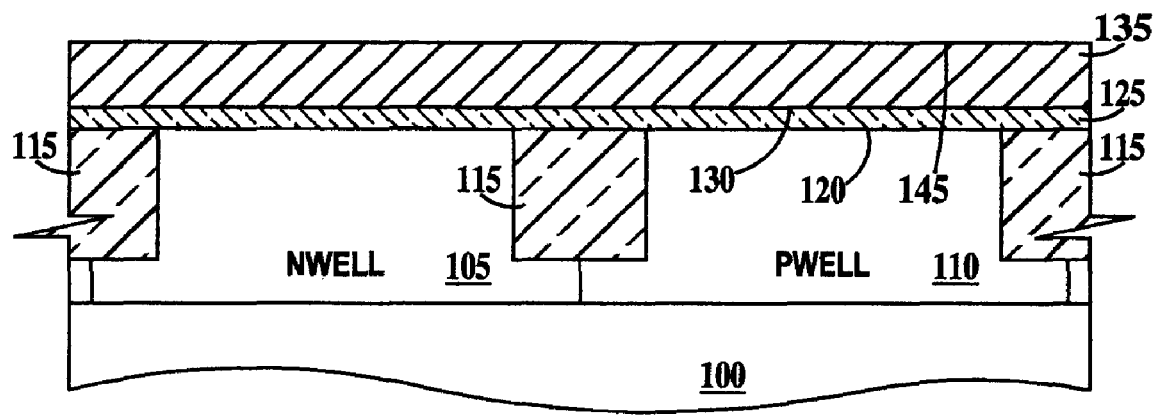
FIGS. 3A through 3D are partial cross-sectional views illustrating initial steps for fabricating doped polysilicon lines and gates according to a third embodiment of the present invention.
Figure 3B:
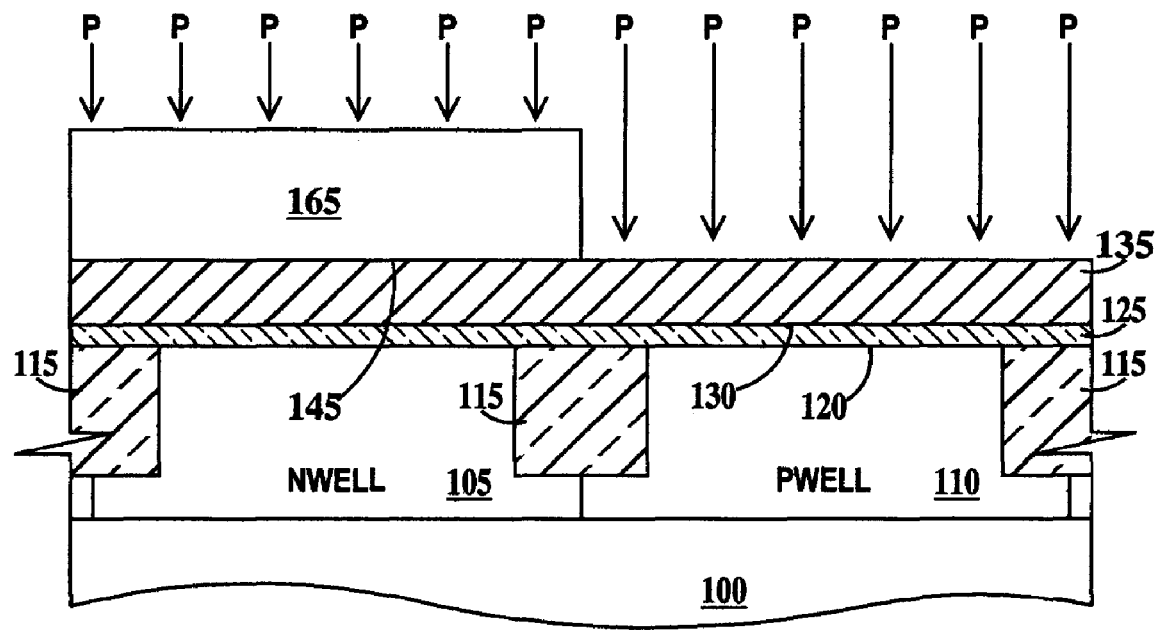

FIGS. 3A through 3D are partial cross-sectional views illustrating initial steps for fabricating doped polysilicon lines and gates according to a third embodiment of the present invention. FIG. 3A is identical to FIG. 1A. In FIG. 3B, a photoresist layer 165 is formed on top surface 145 of polysilicon layer 135. Photoresist layer 165 is then removed from over P-well 110 by one of any number of photolithographic methods known in the art. Then a phosphorus ion implantation is performed. Photoresist layer 165 is of sufficient thickness to about block phosphorus ion implantation into polysilicon layer 135 over N-well 105. The ion implantation is performed to place the peak of the implanted phosphorus distribution concentration proximate to top surface 145 of polysilicon layer 135. The ion implantation is further performed so that the concentration distribution profile of implanted phosphorus is such as to not significantly effect the overall P dopant level of P-well 110. The phosphorus ion implant concentration distribution profile is illustrated in FIG. 4 and described infra. In one example, with polysilicon layer 135 having a thickness of about 0.15 nm, phosphorus is implanted at a dose of about 5E14 atm/cm$^2$ to about 5E16 atm/cm$^2$ at an energy of about 30 Kev or less. Arsenic may be subsituted for phosphorus. In one example, with polysilicon layer 135 having a thickness of about 0.15 nm, arsenic is implanted at a dose of about 5E14 atm/cm$^2$ to about 5E16 atm/cm$^2$ at an energy of about 60 Kev or less. In other examples, the phosphorus and arsenic doses and energies should be scaled proportionally to the thickness of polysilicon layer 135.

Figure 3C:
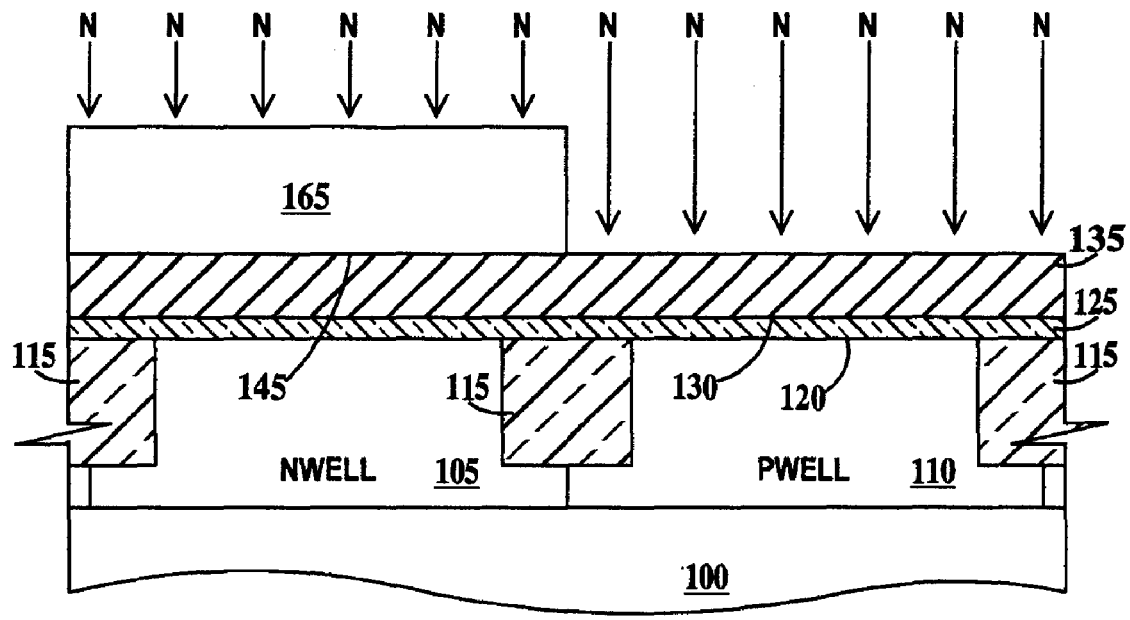

In FIG. 3C, a nitrogen containing species ion implantation is performed. Photoresist layer 165 is of sufficient thickness to about block nitrogen species ion implantation into polysilicon layer 135 over N-well 105. The ion implantation is performed to place the peak of the implanted nitrogen species distribution concentration profile proximate to top surface 145 of polysilicon layer 135. The ion implantation is further performed so that the concentration of implanted nitrogen penetrating into either gate dielectric layer 125 and P-well 110 is not significant. The nitrogen ion implant concentration distribution profile is illustrated in FIG. 4 and described infra. In one example, nitrogen (as N) is implanted at a dose of about 1E14 atm/cm$^2$ to about 4E15 atm/cm$^2$ at an energy of about 20 Kev or less. In other examples, the nitrogen dose and energy should be scaled proportionally to the thickness of polysilicon layer 135. Other suitable nitrogen species include but is not limited to $N_2$, NO, $NF_3$, $N_2O$ and $NH_3$. Photoresist layer 165 is then removed.

Figure 3D:
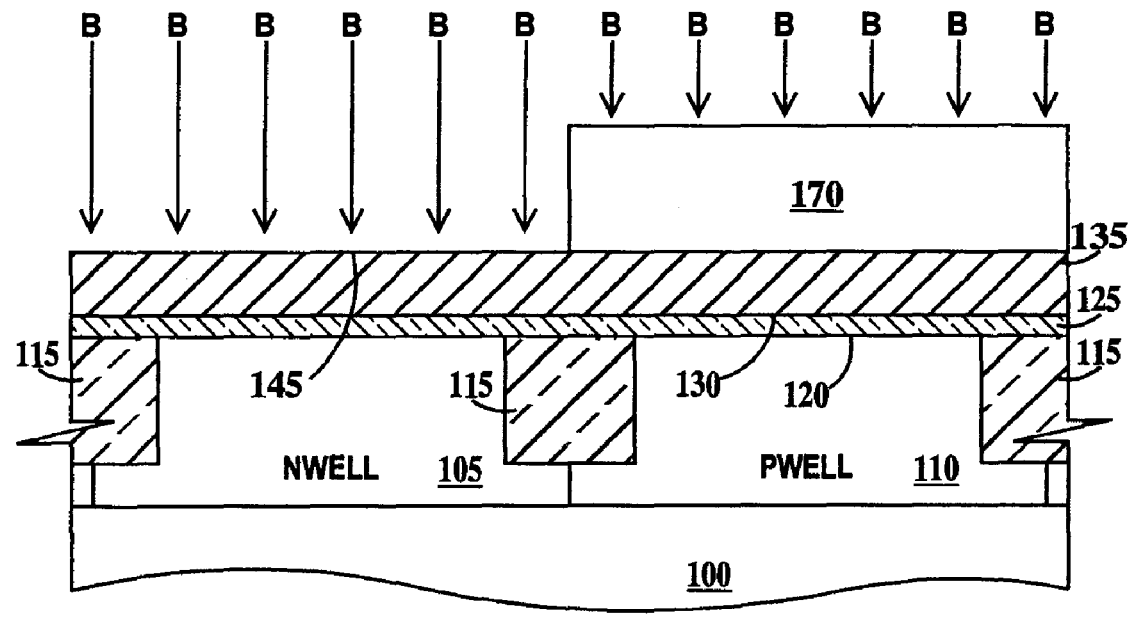

In FIG. 3D, a photoresist layer 170 is formed on top surface 145 of polysilicon layer 135. Photoresist layer 170 is then removed from over N-well 105 by one of any number of photolithographic methods known in the art. Then a boron ion implantation is performed. Photoresist layer 170 is of sufficient thickness to about block boron ion implantation into polysilicon layer 135 over P-well 110. The ion implantation is performed to place the peak of the implanted phosphorus distribution concentration profile proximate to top surface 145 of polysilicon layer 135. The ion implantation is further performed so that the concentration distribution profile of implanted boron is such as to not significantly effect the overall N dopant level of N-well 105. Photoresist layer 170 is then removed. The steps illustrated in FIGS. 5A and 5B are next performed.

The present invention may be practiced by (1) fully matching ion implantation concentration profiles (concentration vs. ion implanted distance) of N-dopant (i. e. phosphorus or arsenic) and nitrogen species at the same distance into the polysilicon, by (2) matching ion implantation concentration profiles of N-dopant and nitrogen species, within a predetermined concentration range, at the same distances into the polysilicon, by (3) matching, within a predetermined concentration range, the surface concentrations of N-dopant and nitrogen in the polysilicon, or by (4) by matching, within a predetermined concentration range, peak concentrations of N-dopant and nitrogen at the same distance into the polysilicon.

FIG. 4 is a plot of concentration of implanted species versus distance from a top surface of a doped polysilicon layer according to the present invention. In FIG. 4, curve 175 (N-dopant) and 180 (nitrogen species) are illustrated using option (2), matching ion implantation concentration profiles of N-dopant and nitrogen species, within a predetermined concentration range, at the same distances into the polysilicon. That is, an equation defining curve 175 and an equation defining curve 180 would yield, for the same distance from the top surface of the polysilicon, a concentration of implanted species within predetermined range of concentration of each other. In a full ion implantation profiles match, option (1) curves 175 and 180 would overlay.

In FIG. 4, the N-dopant (phosphorus or arsenic) ion implantation concentration distribution profile is indicated by curve 175 and the nitrogen species ion implantation concentration distribution profile is indicated by curve 180. While curve 180 is illustrated above curve 175, curve 175 could be above 180. Also curve 175 and curve 180 could cross at one or more points. The exact relationship between curves 175 and 180 is determined by the specific ion implant dose and energy or the N dopant and the specific ion implant dose and energy or the nitrogen. The surface distribution concentration C2A of curve 175 and C2B of curve 180 occur respectively at distance 0 into the polysilicon layer. In one example, C2A is between about 1E18 atm/cm$^3$ and about 1E21 atm/cm$^3$ and concentration C2B is about 1E18 atm/cm$^3$ and about 1E22 atm/cm$^3$. The ranges of values for C2A and C2B may overlap.

The peak distribution concentration C3A of curve 175 and C3B of curve 180 occur respectively proximate to the surface of the polysilicon at distance D1A and D1B into the polysilicon layer. In one example, C3A is between about 1E18 atm/cm$^3$ and about 1E22 atm/cm$^3$ and concentration C3B is about 1E18 atm/cm$^3$ and about 1E21 atm/cm$^3$. The ranges of values for C3A and C3B may overlap.

In one example D1A is between about 0 nm and about ⅓ the thickness of the polysilicon and depth D1B is about 0 nm to about ⅔ the thickness of the polysilicon. The ranges for values for D1A and D1B may overlap.

A concentration C1 is defined in FIG. 4 for curve 175 at a distance D2A and for curve 180 at a distance D2B into the polysilicon layer. D2A is between about 10 nm and the thickness of the polysilicon and D2B is between about 50% and about 150% of D2A. Concentration C1 is a concentration at which an insignificant amount to none of the ion implanted species exists hence essentially the implanted N dopant species and implanted nitrogen containing species are contained with the polysilicon layer. An insignificant amount of implanted species is defined as an amount of implanted species, that if present, would not significantly effect chemical processes or electrical parameters of the polysilicon layer (or gate dielectric layer or P-well) in which the implanted species is present.

Table I summarizes the relationship between curve 175 (N Dopant) and curve 180 (Nitrogen species).

TABLE I

|  | Minimum Value | Maximum Value |
| --- | --- | --- |
| N Dopant Surface Concentration (C2A) | about 1E18 atm/cm$^3$ | about 1E22 atm/cm$^3$ |
| Nitrogen Species Surface Concentration(C2B_ | about 1E18 atm/cm$^3$ | about 1E21 atm/cm$^3$ |
| N Dopant Peak Concentration (C3A) | about 1E18 atm/cm$^3$ | about 1E22 atm/cm$^3$ |
| Nitrogen Species Peak Concentration(C3B) | about 1E18 atm/cm$^3$ | about 1E22 atm/cm$^3$ |
| N Dopant Peak Depth (D1A) | about 0 nm | about equal to ⅓ the polysilicon thickness |
| Nitrogen Species Peak Depth (D1B) | about 0 nm | about equal to ⅔ the polysilicon thickness |
| N Dopant and Nitrogen Species Insignificant Concentration (C1) | Not Applicable | about 1E15 atm/cm$^3$ |
| N Dopant Insignificant Concentration Depth (D2A) | 10 nm | about equal to the full thickness of the polysilicon |

TABLE I-continued

| | Minimum Value | Maximum Value |
|---|---|---|
| Nitrogen Species Insignificant Concentration Depth (D2B) | about 150% of D1A | about 150% of D2A |

Also in FIG. 4, the gate dielectric layer occurs between a distance D3 and D4. Distance D3 is the same as the thickness of the polysilicon layer discussed supra in reference to FIG. 1A and (D4-D3) is the thickness of the gate dielectric layer discussed supra in reference to FIG. 1A.

FIGS. 5A and 5B are partial cross-sectional views illustrating common intermediate steps for fabricating doped polysilicon lines and gates according to the present invention. In FIG. 5A, polysilicon layer 135 (see FIG. 1D, 2D or 3D} is etched into gate electrodes 185A and 185B. Formation of gate electrodes 185A and 185B may be accomplished by one of any number of plasma etch processes selective to etch polysilicon over oxide well known in the art.

In FIG. 5B, an oxidation is performed to simultaneously grow a thermal oxide layer 190A over sidewalls 195A and a top surface 200A of gate electrode 185A and a thermal oxide layer 190B over sidewalls 195B and a top surface 200B of gate electrode 185B. The width of gate electrode 185A at top surface 200A and the width of gate electrode 185B at top surface 200B are both about equal to W1. Gate electrode 185A is doped P type and gate electrode 185B is doped N type. Gate electrode 185B (and possibly gate electrode 185A depending upon which embodiment of the present invention is used prior to the thermal oxidation step) has also been nitrogenated by the nitrogen ion species ion implantation described supra. This reduces (retards) the thermal oxidation rate of N-doped polysilicon. In one example, the thermal oxidation rate of N-doped polysilicon is retarded to be about the same as the thermal oxidation rate of P-doped polysilicon. An example of a thermal oxidation is a furnace oxidation performed for in about a 97% $O_2$ and about 3% HCL generating gas a temperature of about 750° C. for 35 minutes which will grow about 40 angstroms of Si)2 on <100> single-crystal silicon. The steps illustrated in FIGS. 7A through 7E are next performed.

Figure 6:
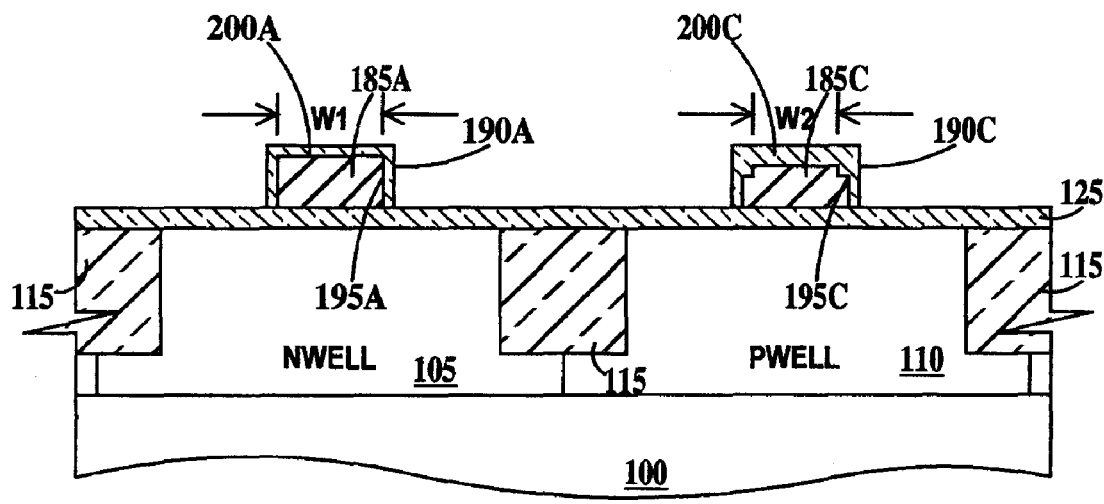
FIG. 6 is a partial cross-sectional view of a problem solved by the present invention.

FIG. 6 is a partial cross-sectional view of a problem solved by the present invention. In FIG. 6, the situation that would otherwise prevail if the nitrogen species ion implantation had not been performed. After thermal oxidation, gate electrode 190C has a width W2 at a top surface 200C (where W2 is less than W1) because N-doped polysilicon oxidizes at a faster rate than P-doped polysilicon. The situation wherein the N-dopant concentration is higher near a top surface 200C of gate electrode 185C is illustrated.

Table II illustrates the effect of nitrogen species ion implantation:

TABLE II

| Nitrogen Implant | Thermal Oxide Thickness | | Polysilicon Width at Top | |
|---|---|---|---|---|
| Energy and Dose | N-doped Polysilicon | P-doped Polysilicon | N-doped Polysilicon | P-doped Polysilicon |
| NONE | 149 Å | 61 Å | 13 nm | 28 nm |
| 6.3 Kev, 5E15 atm/cm² | 64 Å | 58 Å | 23 nm | 27 nm |
| 6.3 Kev, 1E16 atm/cm² | 52 Å | 58 Å | 23 nm | 30 nm |

Figure 7A:
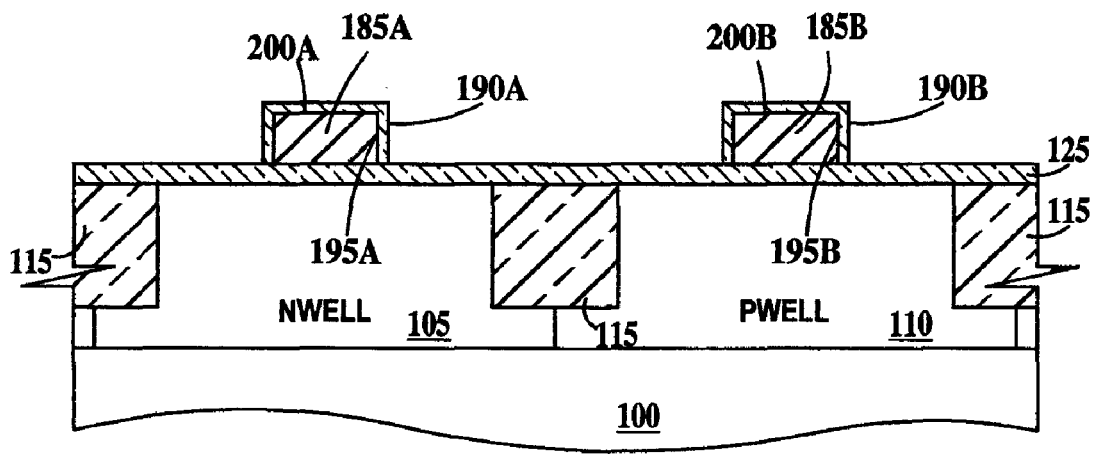
FIGS. 7A through 7E are partial cross-sectional views illustrating common last steps for fabricating doped polysilicon lines and gates according to the present invention.
Figure 7B:
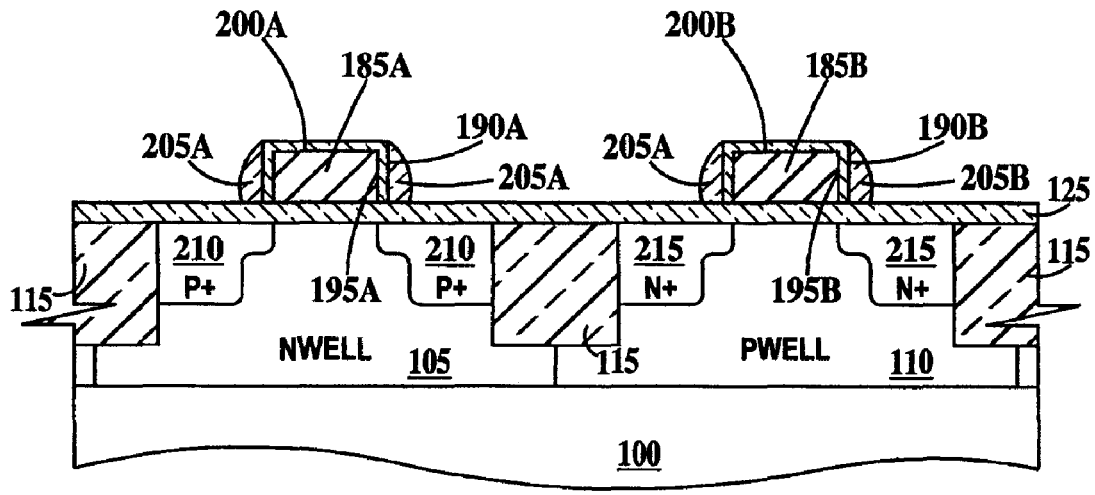

FIGS. 7A through 7E are partial cross-sectional views illustrating common last steps for fabricating doped polysilicon lines and gates according to the present invention. FIG. 7A is identical to FIG. 5B. In FIG. 7B, dielectric spacers 205A and 205B are formed over thermal oxide layers 190A and 190B on sidewalls 195A and 195B of gate electrodes 185A and 185B respectively. Spacers 205A and 205B may be formed by deposition of a conformal material (for example, silicon nitride) followed by a reactive ion etch (RIE) to remove the conformal material from surfaces perpendicular to the direction of the ion flux. Next, well known in the art extension and/or halo and source drain ion implants are performed to P+ source drains 210 in N-well 105 and N+ source drains 215 in P-well 115. Additional spacers may be formed between various extension, halo and source/drain ion implants.

Figure 7C:
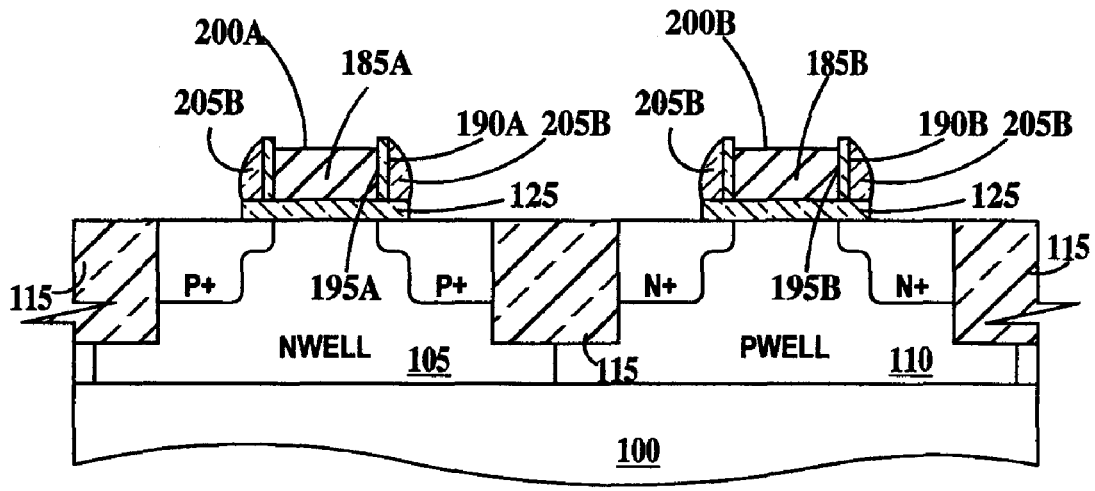

In FIG. 7C, gate dielectric layer 125 is removed wherever the gate dielectric layer is not protected by gate electrodes 185A and 185B and by spacers 105A and 205B. (The gate dielectric on the sidewalls of the gate electrodes also protects the underlying gate dielectric layer.) Also, thermal oxide layer 190A and 190B on top surfaces 200A and 200B of gate electrodes 185A and 185B respectively is removed. Gate dielectric layer 125 and thermal oxide layer 190A and 190B removal may be accomplished, for example, using a dilute aqueous HF containing solution.

Figure 7D:
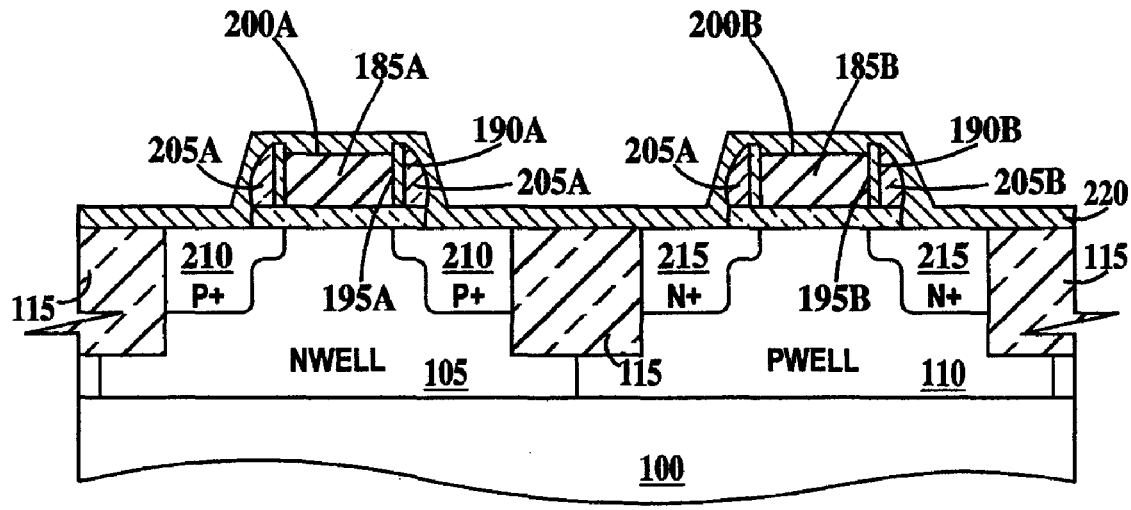
Figure 7E:
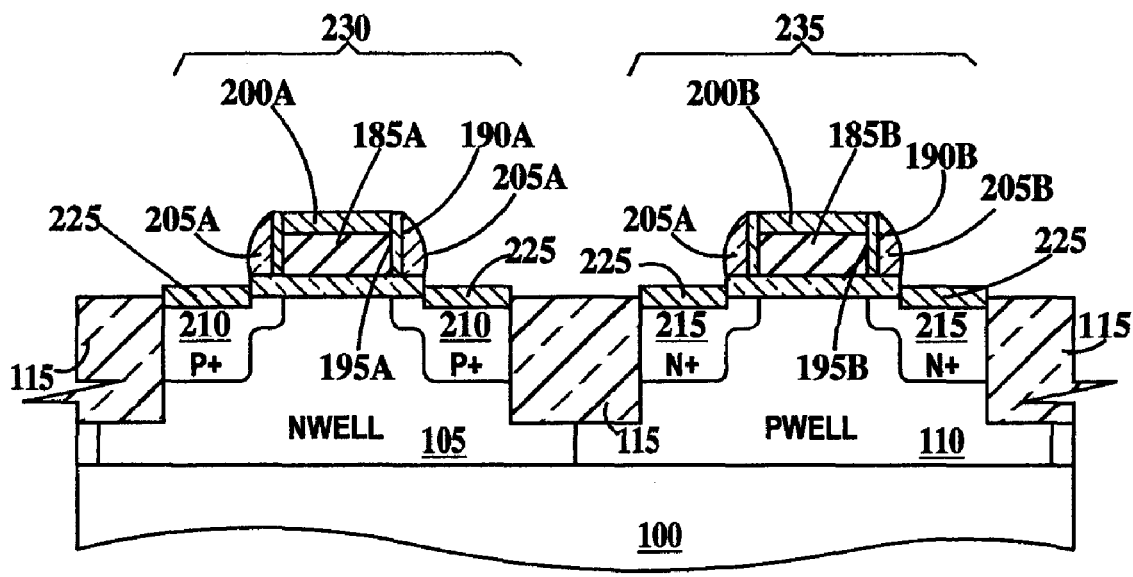

In FIG. 7D a metal layer 220 is deposited. Metal layer 220 may be nickel, titanium, platinum or cobalt. In FIG. 7E, a portion of metal layer 220 in contact with gate electrodes 185A and 185B and with P+ source drains 210 and N+ source/drains 215 is converted to a metal silicide 225 by annealing and removing unreacted metal layer 220 by methods well known in the art. Fabrication of a PFET 230 and an NFET 235 having similar gate electrode linewidths and resistivity is now complete.

Thus, the present invention provides a method of fabricating doped polysilicon lines and gates with improved linewidth control.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating a semiconductor structure, comprising:
   (a) providing a substrate;
   (b) forming a dielectric layer on a top surface of said substrate;
   (c) forming a polysilicon layer on a top surface of said dielectric layer;

(d) implanting a less than whole first portion of said polysilicon layer with N-dopant species, said N-dopant species about contained within said polysilicon layer;

(e) implanting a less than whole second portion of said polysilicon layer with P-dopant species, said second portion different from said first portion, said P-dopant species about contained within said polysilicon layer;

(f) implanting said first portion of said polysilicon layer with a first nitrogen containing species, said first nitrogen containing species essentially contained within said polysilicon layer; and after (a), (b), (c), (d), (e) and (f), (g) patterning said first portion of said polysilicon layer into a first polysilicon line and patterning said second portion of said polysilicon layer into a second polysilicon line.

2. The method of claim 1, further including:
prior to (g), implanting said second portion of said polysilicon layer with a second nitrogen containing species.

3. The method of claim 1, wherein a peak concentration of said N-dopant species is about equal to a peak concentration of said first nitrogen containing species at about a same distance from a top surface of said polysilicon layer.

4. The method of claim 1, wherein a surface concentration of said N-dopant species is about equal to a surface concentration of said first nitrogen containing species at about a same distance from a top surface of said polysilicon layer.

5. The method of claim 1, wherein said N-dopant species and said first nitrogen containing species have about a same ion implantation concentration profile.

6. The method of claim 1, wherein a surface concentration of said N-dopant species is between about 1E18 atm/cm$^3$ to about 1E22 atm/cm$^3$ and a surface concentration of said first nitrogen containing species is between about 1E18 atm/cm$^3$ to about 1E21 atm/cm$^3$.

7. The method of claim 1, wherein:
wherein a peak concentration of said N-dopant species is between about 1E18 atm/cm$^3$ to about 1E22 atm/cm$^3$ and a peak concentration of said first nitrogen containing species is between about 1E18 atm/cm$^3$ to about 1E21 atm/cm$^3$; and said peak concentration of said N-dopant species occurring between a distance of about 0 nm and about 1/3 of a thickness of said polysilicon layer from a top surface of said polysilicon layer and said peak concentration of said nitrogen containing species occurring between about 0 nm to about 2/3 of said thickness of said polysilicon layer from said top surface of said polysilicon layer.

8. The method of claim 1, wherein:
said N-dopant species is selected from the group consisting of phosphorus and arsenic; and
said first nitrogen containing species is selected from the group consisting of N, $N_2$, NO, $NF_3$, $N_2O$ and $NH_3$.

9. The method of claim 1, further including:
before (b), forming an N-well and a P-well in said substrate, wherein at least a portion of said first polysilicon line is formed over said P-well formed in said substrate and at least a portion of said second polysilicon line is formed over said N-well formed in said substrate, wherein an NFET gate electrode comprises a portion of said first polysilicon line and wherein a PFET gate electrode comprises a portion of said second polysilicon line; and after (g), (h) performing a thermal oxidation of sidewalls and top surfaces of said NFET and PFET gate electrodes to form a thermal oxide layer on sidewalls of said NFET and PFET gate electrodes.

10. The method of claim 9, wherein said nitrogen containing species retards oxidation of said NFET gate electrode.

11. The method of claim 9, further including:
after (g), (i) implanting regions of said P-well on opposite sides of said NFET gate electrode with an N-type dopant species to form a source and a drain in said P-well and implanting regions of said N-well on opposite sides of said PFET gate electrode with a P-type dopant species to form a source and a drain in said N-well.

12. The method of claim 11, further including:
after (i), forming respective metal silicide layers on said surfaces of said NFET and PFET gate electrodes and said sources and drains in said N-well and said P-well.

13. The method of claim 9, further including,
before forming said P-well and N-well, forming a dielectric trench isolation in said substrate, said dielectric trench isolation extending from said top surface of said substrate into said substrate, said P-well and said N-well abutting opposite sidewalls of said trench isolation.

14. The method of claim 1, further including:
forming a dielectric trench isolation in said substrate, said dielectric trench isolation extending from said top surface of said substrate into said substrate.

15. The method of claim 14, wherein (d) includes forming a first ion implantation masking layer on a top surface of said polysilicon layer, said first ion implantation masking layer overlapping said trench dielectric layer, covering said second portion of said polysilicon layer and preventing implantation of said N-dopant species into said second portion of said polysilicon layer, and wherein (e) includes forming a second ion implantation masking layer on a top surface of said polysilicon layer, said second ion implantation masking layer overlapping said trench dielectric layer, covering said first portion of said polysilicon layer and preventing implantation of said P-dopant species into said first portion of said polysilicon layer.

16. The method of claim 15, wherein (e) includes forming a third ion implantation masking layer on a top surface of said polysilicon layer, said third ion implantation masking layer overlapping said trench dielectric layer, covering said second portion of said polysilicon layer and preventing implantation of said nitrogen containing species into said second portion of said polysilicon layer.

17. The method of claim 14, wherein (e) includes forming an ion implantation masking layer on a top surface of said polysilicon layer, said ion implantation masking overlapping said trench dielectric layer, covering said second portion of said polysilicon layer and preventing implantation of said nitrogen containing species into said second portion of said polysilicon layer.

18. The method of claim 2, wherein said first and second nitrogen containing species are the same species.

19. The method of claim 2, wherein said first and second nitrogen containing species are the same species and (f) and (h) are performed simultaneously.

* * * * *